United States Patent
Takemura et al.

(10) Patent No.: US 9,553,004 B2
(45) Date of Patent: Jan. 24, 2017

(54) CLEANING METHOD

(75) Inventors: Makoto Takemura, Tokyo (JP);
Keiichiro Mori, Tokyo (JP)

(73) Assignee: SUMCO Corporation, Minato-ku, Tokyo (JP)

( * ) Notice: Subject to any disclaimer, the term of this patent is extended or adjusted under 35 U.S.C. 154(b) by 787 days.

(21) Appl. No.: 13/512,735

(22) PCT Filed: Sep. 29, 2010

(86) PCT No.: PCT/JP2010/005868
§ 371 (c)(1),
(2), (4) Date: May 30, 2012

(87) PCT Pub. No.: WO2011/074160
PCT Pub. Date: Jun. 23, 2011

(65) Prior Publication Data
US 2012/0234358 A1    Sep. 20, 2012

(30) Foreign Application Priority Data

Dec. 14, 2009 (JP) ................................. 2009-283011

(51) Int. Cl.
*H01L 21/67* (2006.01)
*H01L 21/02* (2006.01)
*B08B 3/04* (2006.01)

(52) U.S. Cl.
CPC ........... *H01L 21/67057* (2013.01); *B08B 3/04* (2013.01); *H01L 21/02052* (2013.01)

(58) Field of Classification Search
CPC ....... H01L 21/67057; B08B 3/048; B08B 3/02
USPC .......................................................... 134/26
See application file for complete search history.

(56) References Cited

U.S. PATENT DOCUMENTS

| | | | |
|---|---|---|---|
| 2002/0036002 A1* | 3/2002 | Nakatou | ........................ 134/18 |
| 2007/0034229 A1 | 2/2007 | Okuuchi et al. | |
| 2008/0202260 A1 | 8/2008 | Yamamoto | |

FOREIGN PATENT DOCUMENTS

| | | |
|---|---|---|
| JP | H09-17763 | 1/1997 |
| JP | 10209110 A | 8/1998 |
| JP | H10209110 A | 8/1998 |
| JP | 2000037695 A | 2/2000 |
| JP | 2002-329691 A | 11/2002 |
| JP | 2005109423 A | 4/2005 |
| JP | 2007048918 A | 2/2007 |

(Continued)

OTHER PUBLICATIONS

Machine translation, KR20070033129, Lim et al., 2007.*

(Continued)

*Primary Examiner* — Michael Kornakov
*Assistant Examiner* — Natasha Campbell
(74) *Attorney, Agent, or Firm* — Reza Mollaaghababa; Thomas Engellenner; Pepper Hamilton LLP

(57) ABSTRACT

To provide a cleaning method which makes it possible to reduce alkaline component mixing in an ozone cleaning solution, thereby preventing impairment of cleaning ability of ozone. In the cleaning method, before chuck members retain another workpiece having previously been dipped in an ozone cleaning solution in an ozone cleaning tank, alkaline component attached to part of transfer arms and the chuck members is removed by cleaning, thereby preventing the alkaline component from mixing into the ozone cleaning solution.

7 Claims, 6 Drawing Sheets

(56) References Cited

FOREIGN PATENT DOCUMENTS

| | | |
|---|---|---|
| JP | 2008210956 A | 9/2008 |
| JP | 2009017763 A | 1/2009 |
| KR | 1999-0066684 | 8/1999 |
| KR | 2006076813 A * | 7/2006 |

OTHER PUBLICATIONS

Machine translation, KR20050051292, B. Lee, 2005.*
Machine translation: KR10-2006-0076813A; Cha, H.; 2006.*
Korean Office Action in Applicant's corresponding Korean patent application No. 10-2012-7018394, dated Mar. 11, 2014 (8 pages).
Office Action in Applicant's corresponding German Patent App. No. 112010004793.6 dated Jan. 25, 2016 (7 pages).

* cited by examiner (a)

(b)

CLEANING METHOD

TECHNICAL FIELD

The present invention relates to a method of cleaning a workpiece such as a wafer. The present invention relates in particular to a method of transferring a plurality of workpieces into an ozone cleaning tank filled with an ozone cleaning solution and an alkaline cleaning tank filled with a solution containing an alkaline component using one transfer means thereby sequentially and separately cleaning the workpieces.

RELATED ART

In recent years, accompanying improvement in the degree of integration of semiconductor devices, more stringent cleanliness has been required for semiconductor production processes. Contaminants on a wafer surface affect the characteristics of the device, and particles on a wafer surface are said to require control of the grain size of 1/10 the design rule size in general. Further, metal impurities of $10^{10}$ atoms/cm$^2$ or more are known to affect the electrical characteristics.

In order to obtain an efficient organized cleaning process, it is important to select cleaning methods most suitable for objects to be removed, and to efficiently combine the methods. Conventionally, a cleaning method which is referred to as an RCA cleaning process, in which SC-1 (standard cleaning-1) using a mixed solution of ammonium hydroxide and a hydrogen peroxide solution and SC-2 (standard cleaning-2) using a mixed solution of hydrochloric acid and a hydrogen peroxide solution have been used, has been commonly used for cleaning wafer surfaces.

However, this method has problems of many cleaning steps, an enormous amount of cleaning solution and purified water required for washing the cleaning solutions away, and high cost for processing waste fluids.

Meanwhile, an ozone cleaning process is given as a technique for solving the above problems. An ozone cleaning process is a method of cleaning workpieces using an ozone cleaning solution that is ultrapure water with ozone added. This ultrapure water with ozone is mere ultrapure water in which several ppm of ozone is dissolved at room temperature; however, it has higher oxidizability than conventional SC-1, and dissolved ozone in the pure water breaks down into mere high purity water by self decomposition. Therefore, ultrapure water with ozone is widely used as a high cleanliness cleaning solution of which waste fluid can be easily processed for the purpose of decomposing an organic substance attached to a wafer surface and for forming an oxide film as a protective film on the wafer surface. Patent Document 1 discloses a technique of obtaining a highly clean wafer by cleaning a wafer using the above ozone cleaning solution before the SC-1 cleaning process.

A wafer cleaning is generally performed by dipping one or a plurality of wafers sequentially in cleaning solutions in individual process tanks. Such a wafer cleaning method includes two known ways of methods: one is a cassette cleaning method, and the other is a cassetteless cleaning method.

A cassette cleaning method is, for example, a cleaning by dipping wafers stored in a cassette together with the cassette in a cleaning solution in a cleaning tank as illustrated in Patent Document 2. Specifically, a cassette storing a plurality of (for example, 25) wafers is supported by an openable and closable pair of U-shaped chuck members integrally provided on a pair of arms of a transfer means in a hanging manner, thereby moving and sequentially dipping the wafers together with the cassette in the cleaning solutions in the process tanks in accordance with the processing processes.

On the other hand, in a cassetteless cleaning method, a holding means 102 for placing and fixing a wafer 101 in a cleaning tank 100 is provided in advance, and the wafer 101 being retained by chuck members 104 of transfer arms 103 of a transfer means is placed onto the holding means 102 in the cleaning tank 100 to clean the wafer with a cleaning solution 105 in the cleaning tank 100 as illustrated as an example in FIG. 1. Conventionally, during cleaning of the wafer 101, the transfer means has been made to wait outside the cleaning tank 100.

In such a method in which a transfer means is made to wait outside a cleaning tank 100 until cleaning of the wafer 101 is completed, however, a transfer means is necessarily provided for each corresponding cleaning tank.

Thus, increase in the number of transfer means is another problem. To address this problem, during cleaning of the wafer 101 in the cleaning tank 100, the transfer means transfers another wafer to a cleaning tank other than the cleaning tank 100, thereby preventing increase in the number of transfer means. FIG. 2 is a schematic view for illustrating an example of the arrangement of cleaning tanks and the operation of a conventional transfer means for solving the above problem. In this example, a method of sequentially and separately transferring a plurality of workpieces using one transfer means is used. In the arrangement of the cleaning tanks in this example, an ozone cleaning tank filled with an ozone cleaning solution, two alkaline cleaning tanks each filled with a solution containing an alkaline component (first SC-1 tank and second SC-1 tank), and a pure water cleaning tank are provided in this order. Two alkaline cleaning tanks are provided to increase SC-1 cleaning efficiency; however, the number of alkaline cleaning tanks is not limited to this, and one tank or three or more tanks may be used.

A transfer means I generally moves in the numerical order as shown with the arrows. The transfer means I here is used for steps from retaining of a workpiece in the ozone cleaning tank to dipping of the workpiece in the pure water cleaning tank. Meanwhile, transfer means II and III are used for transferring the workpiece into the ozone cleaning tank and taking the workpiece out of the pure water cleaning tank, respectively.

The transfer means I transfers one workpiece previously dipped in the ozone cleaning solution of the ozone cleaning tank to the first SC-1 tank, for example (arrow 1). On this occasion, the transfer arms and the chuck members of the transfer means I are dipped together with the workpiece in the first SC-1 tank, so that alkaline component attaches to part of the transfer arms and the chuck members. After a certain time lapse, the transfer means I transfers one workpiece in the first SC-1 tank to the second SC-1 tank (arrow 2). Also in this case, alkaline component of the cleaning solution in the second SC-1 tank is attached to part of the transfer arms and the chuck members of the transfer means I. The transfer means I then transfers another workpiece previously dipped in the ozone cleaning solution of the ozone cleaning tank using the transfer means II to the first SC-1 tank (arrow 3).

On this occasion, specifically, when the transfer arms and the chuck members are put in the ozone cleaning tank to take said other workpiece out, the alkaline component attached to part of the transfer arms and the chuck members is mixed in the ozone cleaning solution. When the alkaline component is mixed in the ozone cleaning solution in this manner, decomposition of ozone dissolved in the ozone cleaning solution is promoted to reduce the concentration of ozone in the ozone cleaning solution, which impairs cleaning ability of ozone. As a result, organic matter remains on the wafer surface, and the thickness of an oxide film on the wafer surface becomes nonuniform, for example, which are problems.

After that, the transfer means I transfers the one workpiece in the second SC-1 tank to the pure water cleaning tank (arrow 4), and then the transfer means I transfers the other workpiece in the first SC-1 tank to the second SC-1 tank (arrow 5). Also in this case, alkaline component in the cleaning solution of the second SC-1 tank is attached to part of the transfer arms and the chuck members of the transfer means I. This transfer means I then transfers still another workpiece having been previously dipped in the ozone cleaning solution of the ozone cleaning tank using the transfer means II to the first SC-1 tank (arrow 6).

In this case, sufficient ozone cleaning is not performed on the workpiece transferred in accordance with the arrow 6. This is because, as shown with arrow 3 in FIG. 2, when the transfer arms and the chuck members are put in the ozone cleaning tank, the alkaline component attached to part of the transfer arms and the chuck members is mixed in the ozone cleaning solution to promote decomposition of ozone dissolved in the ozone cleaning solution, which results in the ozone concentration reduction and consequently in insufficient cleaning ability of ozone.

Patent Document 3 discloses a technique of preventing reduction in the concentration of ozone in an ozone cleaning solution by dissolving carbon dioxide gas or an organic compound in the ozone cleaning solution. In a case where a carbon dioxide gas is dissolved in an ozone cleaning solution, self decomposition of ozone can be suppressed by dissolving a minute amount of carbon dioxide gas in the ozone cleaning solution. However, irrespective of the amount of the carbon dioxide gas dissolved in the ozone cleaning solution, self decomposition of ozone is promoted when alkaline component is mixed in the ozone cleaning solution, which reduces the concentration of ozone in the cleaning solution. On the other hand, when a liquid organic compound is dissolved in the ozone cleaning solution, organic matter remains on a surface of the wafer after ozone cleaning to impair the wafer surface quality, which would adversely affect subsequent device fabrication processes.

PRIOR ART DOCUMENT

Patent Document

[Patent Document 1] JP 2007-48918 A
[Patent Document 2] JP 09-17763 A
[Patent Document 3] JP 2000-37695 A

DISCLOSURE OF THE INVENTION

Problems to be Solved by the Invention

An object of the present invention is to solve the above problems and provide a cleaning method which makes it possible to reduce alkaline component mixing in an ozone cleaning solution, thereby preventing impairment of cleaning ability of ozone.

Means for Solving the Problem

In order to achieve the above object, the present invention primarily includes the following constituent features.

(1) A method of cleaning a plurality of workpieces using a cleaning apparatus having a plurality of cleaning tanks including an ozone cleaning tank filled with an ozone cleaning solution and an alkaline cleaning tank filled with a solution containing an alkaline component, and a transfer means having transfer arms and chuck members provided on the transfer arms, which is movable between the plurality of cleaning tanks, comprising:

with one workpiece of a plurality of workpieces being detachably retained by the chuck members, dipping the workpiece into a cleaning solution in one of the plurality of cleaning tanks at least together with the chuck members and part of the transfer arms;

then detaching the chuck members from the workpiece to move the transfer means during treatment of the workpiece in the cleaning tank; and detachably retaining another workpiece having been dipped in a cleaning solution of another cleaning tank using the chuck member, wherein before the chuck members retain the other workpiece having previously been dipped in the ozone cleaning solution in the ozone cleaning tank, alkaline component attached to part of the transfer arms and the chuck members is removed by cleaning, thereby preventing the alkaline component from mixing into the ozone cleaning solution.

(2) The cleaning method according to (1) above, wherein the cleaning apparatus further includes a pure water cleaning tank for workpieces, filled with purified water for cleaning the workpiece, and the transfer arms and the chuck members are cleaned by being dipped in and then being pulled out of the purified water in the pure water cleaning tank for workpieces.

(3) The cleaning method according to (1) above, wherein the cleaning apparatus further includes a pure water cleaning tank for chuck members, filled with the purified water for cleaning the transfer arms and the chuck members, and the transfer arms and the chuck members are cleaned by being dipped in and then being pulled out of purified water in the pure water cleaning tank for chuck members and by further spraying the transfer arms and the chuck members with purified water during the pullout.

(4) The cleaning method according to (2) above, wherein the transfer arms and the chuck members are pulled out at a rate of 300 mm/sec or less after being dipped in the pure water cleaning tank.

(5) The cleaning method according to (1) above, wherein a concentration of ozone in the ozone cleaning solution after the transfer arms and the chuck members dipped at least once in the solution containing an alkaline component in the alkaline cleaning tank are dipped in the ozone cleaning solution is 3 ppm or more.

(6) The cleaning method according to (1) above, wherein the workpiece is one or a plurality of wafers, or a plurality of wafers stored in a receiver cassette.

Effect of the Invention

According to the present invention, before chuck members retain a workpiece having previously been dipped in an ozone cleaning solution of an ozone cleaning tank, alkaline component attached to part of transfer arms and chuck members is removed by cleaning, thereby preventing alkaline component from mixing in the ozone cleaning solution. Thus, ozone cleaning ability can be prevented from being impaired.

BEST MODE FOR CARRYING OUT THE INVENTION

An embodiment of a cleaning method of the present invention will now be described with reference to the drawings.

Figure 1:
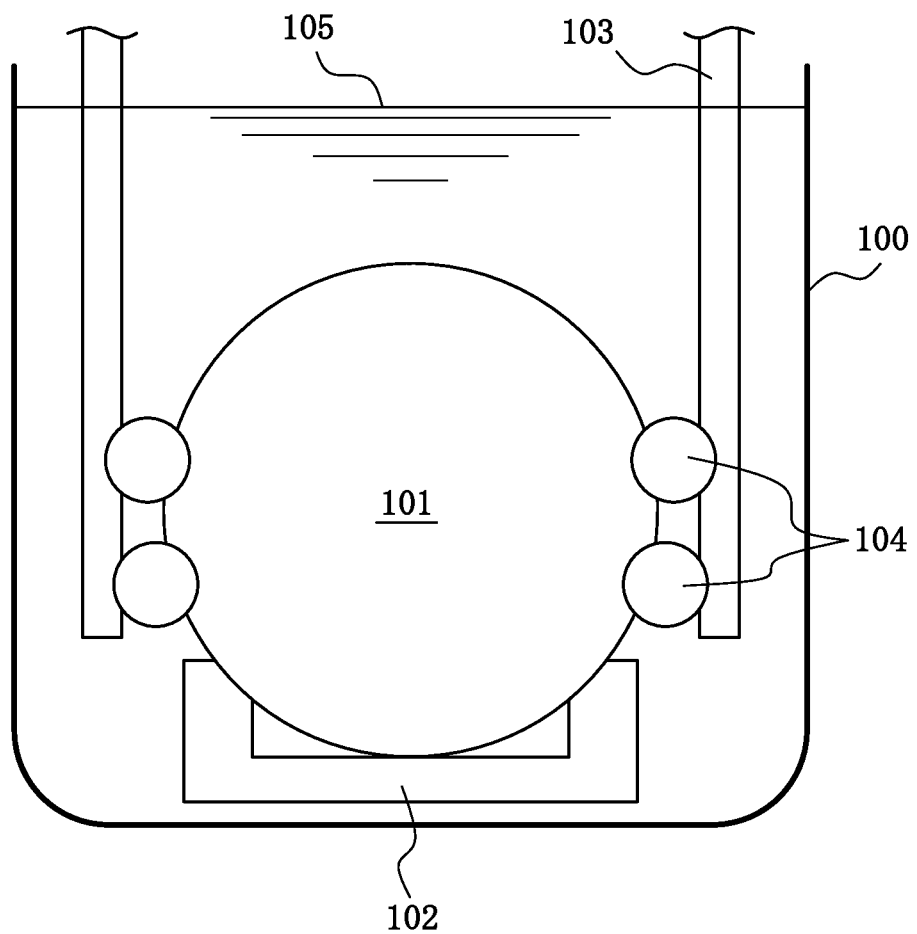
FIG. 1 is a schematic cross-sectional view illustrating a cassetteless cleaning apparatus.
Figure 2:
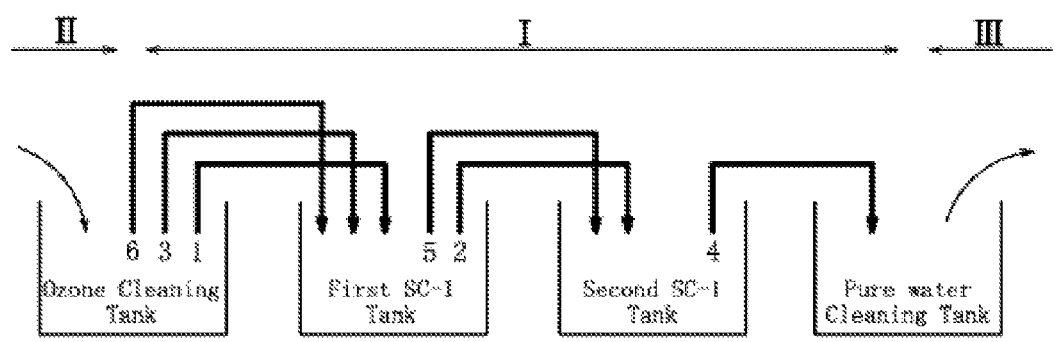
FIG. 2 is a schematic view for illustrating an example of the arrangement of cleaning tanks and a conventional order of moving transfer means.
Figure 3:
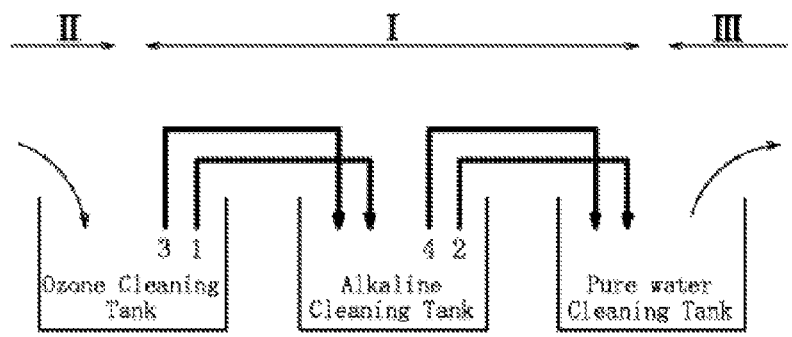
FIG. 3 is a schematic view of an embodiment of the present invention.

In a cleaning method according to the present invention, as in an example shown in FIG. 3, a cleaning apparatus is provided with a plurality of cleaning tanks including an ozone cleaning tank filled with an ozone cleaning solution and an alkaline cleaning tank filled with a solution containing an alkaline component, and a transfer means having transfer arms and chuck members provided on the transfer arms, which is provided to be movable between those plurality of cleaning tanks. The transfer means, for example, has a structure illustrated as in FIG. 1, for previously providing a holding means 102 for placing and fixing a workpiece 101 in a cleaning tank 100, and placing the workpiece 101 retained by chuck members 104 of transfer arms 103 of the transfer means onto the holding means 102 in the cleaning tank 100 to clean the workpiece with a cleaning solution 105 in the cleaning tank 100.

Figure 4:
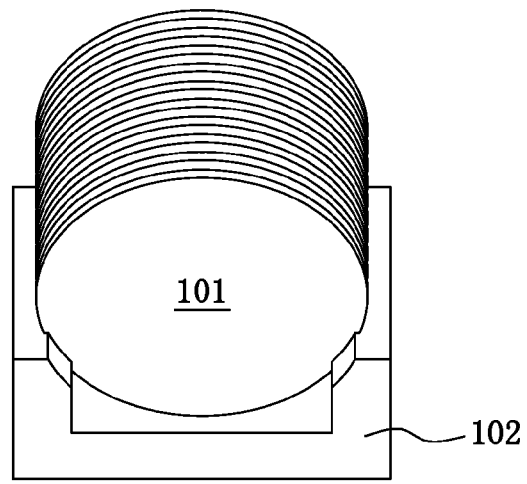
FIG. 4 is a schematic view of a state where a plurality of wafers are placed in a cleaning tank without cassettes.
Figure 5:
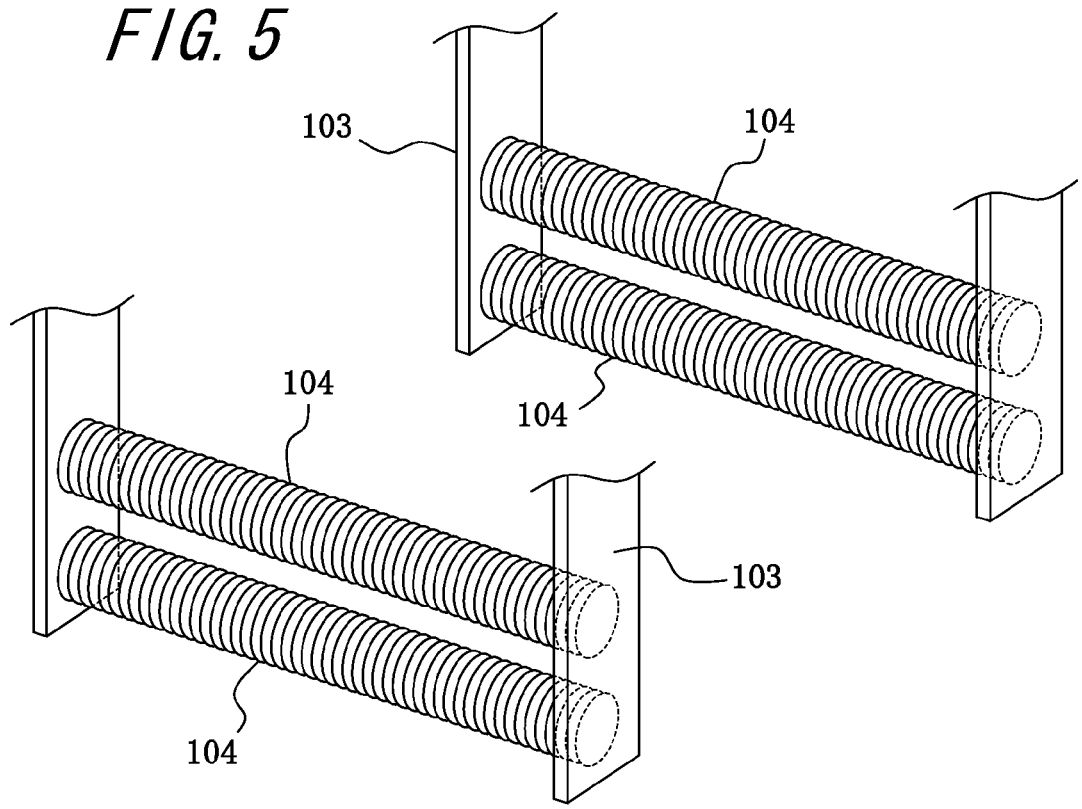
FIG. 5 is a schematic view illustrating part of transfer arms and chuck members of transfer means.
Figure 6:
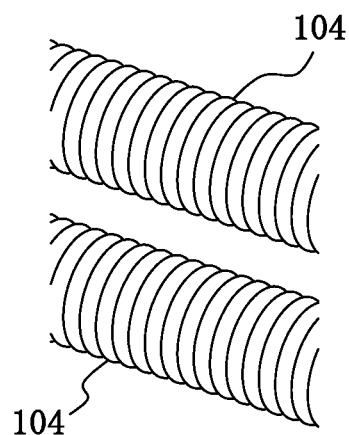
FIG. 6(a) is an enlarged view of chuck members.
FIG. 6(b) is a schematic view of a state where the chuck members retain a wafer.
Figure 6:
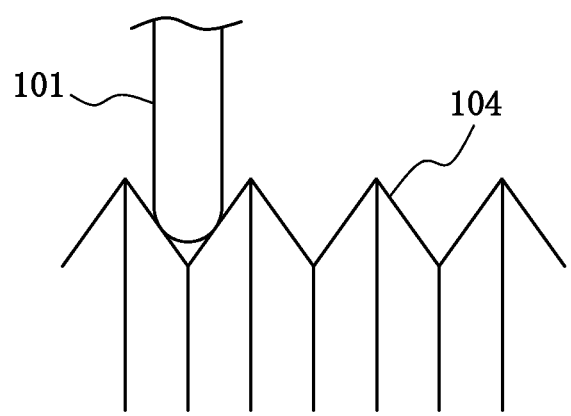

The workpiece 101 may be one or a plurality of wafers or a plurality of wafers stored in a receiver cassette. FIG. 4 is a schematic view of a state where a plurality of wafers 101 are placed on the holding means 102 in the cleaning tank without cassettes. FIG. 5 shows transfer arms 103 and chuck members 104 for transferring such wafers. An enlarged view of the chuck members 104 and a state where the chuck members 104 retain the wafer(s) 101 are shown in FIG. 6(a) and FIG. 6(b), respectively. Here, a plurality of wafers that can be retained by one transfer means are collectively referred to as one workpiece, and a plurality of workpieces means a plurality of groups of such wafers.

As shown in FIG. 3, a transfer means I moves from a cleaning tank to another cleaning tank in the numerical order as shown with the arrows. The transfer means I here is used for steps from retaining a workpiece in the ozone cleaning tank to dipping the workpiece in the pure water cleaning tank. Meanwhile, transfer means II and III are used for dipping the workpiece into the ozone cleaning solution in the ozone cleaning tank and taking the workpiece out of the pure water cleaning tank, respectively. Note that the pure water cleaning tank is a pure water cleaning tank for workpieces, filled with purified water for cleaning the workpiece.

The transfer means I for example transfers one workpiece having previously been dipped in an ozone cleaning solution of the ozone cleaning tank to the alkaline cleaning tank (arrow 1). In this case, the transfer arms and the chuck members of the transfer means I are dipped in the alkaline cleaning tank together with the workpiece, so that alkaline component attaches to part of the transfer arms and the chuck members. After a certain time lapse, the transfer means I transfers the one workpiece in the alkaline cleaning tank to the pure water cleaning tank (arrow 2). On this occasion, after being detached from the workpiece in the pure water cleaning tank, the transfer arms and the chuck members of the transfer means I are cleaned with purified water by being pulled out of the purified water. Then, this transfer means I transfers another workpiece having previously been dipped in the ozone cleaning solution in the ozone cleaning tank by the transfer means II, to the alkaline cleaning tank (arrow 3).

Thus, in this example, the transfer arms and the chuck members are cleaned with purified water in the pure water cleaning tank after being dipped in the alkaline cleaning solution in the alkaline cleaning tank. Therefore, alkaline component can be prevented from mixing in the ozone cleaning solution.

Figure 7:
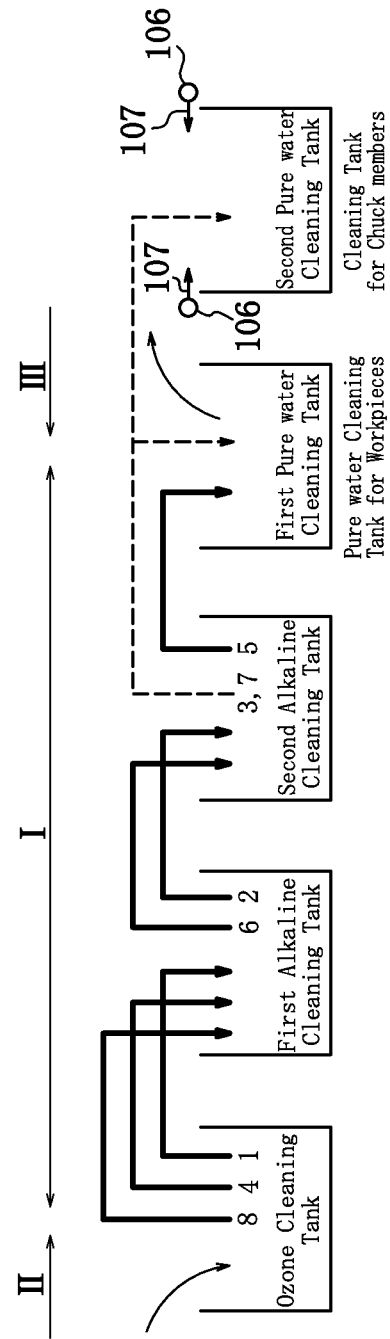
FIG. 7 is a schematic view of an embodiment of the present invention.

FIG. 7 shows another embodiment of a cleaning method of the present invention. The transfer means I, for example transfers one workpiece having previously been dipped in the ozone cleaning solution of the ozone cleaning tank to a first alkaline cleaning tank (arrow 1). In this case, the transfer arms and the chuck members of the transfer means I are dipped in the first alkaline cleaning tank together with the workpiece, so that alkaline component attaches to part of the transfer arms and the chuck members. After a certain time lapse, the transfer means I transfers the workpiece in the first alkaline cleaning tank to a second alkaline cleaning tank (arrow 2). Also in this case, alkaline component in a cleaning solution of the second alkaline cleaning tank is attached to part of the transfer arms and the chuck members of the transfer means I. This being the case, part of the transfer arms and the chuck members of this transfer means I are cleaned with purified water in the pure water cleaning tank (arrow 3).

A cleaning apparatus used in a cleaning method according to the present invention, further includes a pure water cleaning tank for workpieces (corresponding to a first pure water cleaning tank in the diagram), filled with purified water for cleaning workpieces. The transfer arms and the chuck members can be cleaned by being dipped in the purified water of the pure water cleaning tank for workpieces and then being pulled up. This method does not require additional equipment, which is cost-effective.

The transfer arms and the chuck members are preferably pulled out at a rate of 300 mm/sec or less after being dipped in the purified water of the pure water cleaning tank for workpieces. This is because when the pullout rate is more than 300 mm/sec, alkaline component would not be removed sufficiently.

More preferably, a cleaning apparatus used in a method according to the present invention further includes a pure water cleaning tank for chuck members (corresponding to a second pure water cleaning tank in the diagram), filled with purified water for cleaning transfer arms and chuck members. The transfer arms and the chuck members are cleaned by dipping the transfer arms and chuck members in the purified water of the pure water cleaning tank for chuck members and then spraying them with the purified water while they are pulled out of the tank.

In this case, for example, a method of spraying purified water 107 from pure water spray nozzles 106 provided at two positions in an upper part of the pure water cleaning tank for chuck members in FIG. 7 to the transfer arms and the chuck members being pulled out after being dipped in the purified water of the pure water cleaning tank for chuck members can be employed. According to this method, the chuck members on which alkaline component easily remains are sprayed with purified water, so that the alkaline component left on the chuck members can be efficiently removed. Therefore, as described above, a greater cleaning effect can be achieved as compared with the case of cleaning the transfer arms and the chuck members by dipping them in purified water of the pure water cleaning tank for workpieces and then pulling them out as described above.

Methods other than the above can be applied for the method of spraying transfer arms and chuck members with purified water as long as the transfer arms and the chuck members on which alkaline component easily remains can be directly sprayed with purified water. Further, the set positions of the pure water spray nozzles 106 are not limited to the upper part of the pure water cleaning tank for chuck members. Alternatively, a method in which the transfer arms and the chuck members are placed in an upper part of the pure water cleaning tank for workpieces, and the transfer arms and the chuck members are sprayed with the purified water 107 while they are pulled out after being dipped in the purified water of the pure water cleaning tank for workpieces, can be employed. Note that the number of the pure water spray nozzles 106 to be set is determined depending on the size of the workpieces, the size of the cleaning tanks, and the like.

Then, this transfer means I transfers another workpiece having previously been dipped in the ozone cleaning solution of the ozone cleaning tank by the transfer means II, to the first alkaline cleaning tank (arrow 4). Subsequently, this transfer means I transfers the one workpiece in the second alkaline cleaning tank to the first pure water cleaning tank (arrow 5). On this occasion, after being detached from the workpiece in the pure water cleaning tank for workpieces, the transfer arms and the chuck members of the transfer means I are cleaned with purified water by being pulled out of the purified water. Next, this transfer means I transfers another workpiece dipped in an alkaline cleaning solution in the first alkaline cleaning tank to the second alkaline cleaning tank (arrow 6). At this point, alkaline component in the second alkaline cleaning tank is attached to part of the transfer arms and the chuck members of the transfer means I. Accordingly, the transfer arms and the chuck members of this transfer means I are cleaned again with the purified water in the pure water cleaning tank (arrow 7). Then, this transfer means I transfers still another workpiece having previously been dipped in the ozone cleaning solution in the ozone cleaning tank using the transfer means II to the first alkaline cleaning tank (arrow 8).

Thus, in this example, the transfer arms and the chuck members are cleaned with purified water in the pure water cleaning tank after being dipped in the alkaline cleaning solution in the alkaline cleaning tank. Therefore, alkaline component can be prevented from mixing in the ozone cleaning solution.

Figure 8:
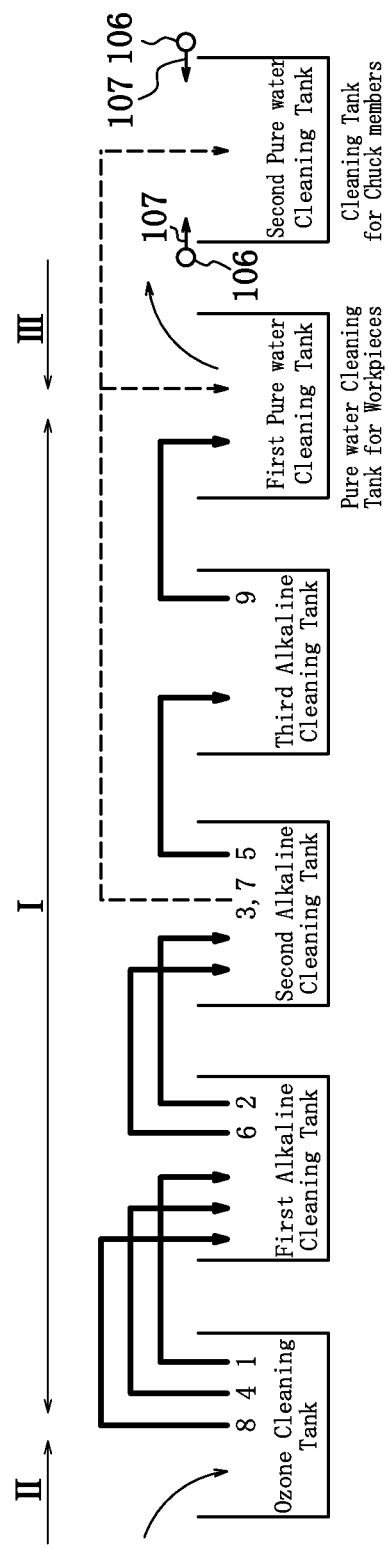
FIG. 8 is a schematic view of an embodiment of the present invention.

FIG. 8 shows another embodiment of a cleaning method of the present invention. The transfer means I, for example transfers one workpiece having previously been dipped in the ozone cleaning solution of the ozone cleaning tank to a first alkaline cleaning tank (arrow 1). In this case, the transfer arms and the chuck members of the transfer means I are dipped in the first alkaline cleaning tank together with the workpiece, so that alkaline component attaches to part of the transfer arms and the chuck members. After a certain time lapse, the transfer means I transfers the workpiece in the first alkaline cleaning tank to a second alkaline cleaning tank (arrow 2). Also in this case, alkaline component in a cleaning solution of the second alkaline cleaning tank attaches to part of the transfer arms and the chuck members of the transfer means I. This being the case, the transfer arms and the chuck members of this transfer means I are cleaned with purified water in the pure water cleaning tank (arrow 3).

Then, this transfer means I transfers another workpiece having previously been dipped in the ozone cleaning solution in the ozone cleaning tank by the transfer means II, to the first alkaline cleaning tank (arrow 4). Subsequently, this transfer means I transfers the one workpiece in the second alkaline cleaning tank to a third alkaline cleaning tank (arrow 5). After that, the transfer means I transfers the other workpiece in the first alkaline cleaning tank to the second alkaline cleaning tank (arrow 6). Also in this case, alkaline component of the cleaning solution in the second alkaline cleaning tank attaches to part of the transfer arms and the chuck members of the transfer means I. Accordingly, the transfer arms and the chuck members of this transfer means I are cleaned again with the purified water in the pure water cleaning tank (arrow 7). Then, this transfer means I transfers still another workpiece having previously been dipped in the ozone cleaning solution in the ozone cleaning tank using the transfer means II to the first alkaline cleaning tank (arrow 8).

Thus, in this example, the transfer arms and the chuck members are cleaned with purified water in the pure water cleaning tank after being dipped in the alkaline cleaning solution in the alkaline cleaning tank. Therefore, alkaline component can be prevented from mixing in the ozone cleaning solution.

The concentration of ozone in the ozone cleaning solution, in which the transfer arms and the chuck members having been dipped at least once in the solution containing an alkaline component in the alkaline cleaning tank is dipped, is preferably 3 ppm or more. When the ozone concentration is less than 3 ppm, the ozone cleaning ability would be insufficient.

Note that the set position of the pure water cleaning tank for chuck members may be either in or outside the row of the plurality of cleaning tanks. Considering that the wafer transfer means moves between the cleaning solution tanks, however, it is preferably placed in the row of the plurality of cleaning tanks. Further, in the embodiment described above, one transfer means is used; however, a plurality of transfer means can be used alternatively.

Note that the above shows examples of exemplary embodiments of the present invention, and the present invention is not limited to those embodiments. In particular, the above embodiments show examples of transferring a plurality of workpieces without intervals; alternatively, the transfer may be performed with an interval of one cleaning tank, or with an interval of two cleaning tanks. Also in this case, the transfer arms and the chuck members are cleaned with purified water in the pure water cleaning tank after being dipped in the alkaline cleaning solution in the alkaline cleaning tank, which can prevent alkaline component from mixing in the ozone cleaning solution.

EXAMPLE

Example 1

Using the arrangement of cleaning tanks and the order of moving a transfer means in FIG. 7, a plurality of workpieces were cleaned. Each of the workpieces is a set of 50 wafers. In this example, for the purpose of observing haze generated on the wafer surface due to dipping of the wafers in an ozone cleaning solution of an ozone cleaning tank, wafers having a water-repellent surface having been cleaned with hydrofluoric acid were cleaned. When the time of dipping in the ozone cleaning solution of the ozone cleaning tank is short, haze generated on the wafer surface cannot be removed; meanwhile, long dipping time leads to reduced productivity although the haze disappears. Thus, the dipping time was set at 5 minutes. Transfer arms and chuck members of the transfer means were cleaned by dipping the transfer arms and the chuck members in purified water in a pure water cleaning tank for workpieces (first pure water cleaning tank) and then pulling them out. In this case, the transfer arms were pulled out of the pure water cleaning tank for workpieces at a pullout rate of 300 mm/sec. 20-ppm ozone water that was ultrapure water in which ozone gas was dissolved was continuously supplied to the ozone cleaning tank as the ozone cleaning solution at a feed rate of 10 L/min. The concentration of ozone in the ozone cleaning tank in which the transfer arms and the chuck members had not been dipped (hereinafter referred to as "initial ozone concentration") was 10 ppm.

The concentration of ozone in the ozone cleaning solution of the ozone cleaning tank immediately after the transfer arms and the chuck members were dipped in the ozone cleaning solution as shown with arrow 4 was measured.

It dropped from the initial ozone concentration of 10 ppm to 3 ppm. When the pullout rate of the transfer arms from the pure water cleaning tank for workpieces was 300 mm/sec, the concentration of ozone in the ozone cleaning solution of the ozone cleaning tank is considered to have dropped because alkaline component attached to the transfer arms and the chuck members was not completely removed, and a minute amount of alkaline component left on the transfer arms and the chuck members was mixed into the ozone cleaning solution to promote decomposition of ozone.

The contact angle of the upper part, central part, and lower part of the wafer having been cleaned with this ozone cleaning solution were measured to be 20°, 10°, and 10°, respectively. The measurement of the contact angles was performed on five to six wafers selected from the 50 wafers. Here, the selection of the wafers was performed, for example, by a method of selecting the 1st, 11th, 21st, 31st, 41st, and 50th wafers from the 50 wafers. Further, the surfaces of all the 50 wafers were visually inspected under a focused lamp, and little haze was observed on the wafer surfaces. Further, the haze (index of the surface roughness) map of all the 50 wafers was measured by means of a laser surface inspector (SP-1, produced by KLA-Tencor Corporation) to find slight patterns only on the uppermost part of the wafers, which are so little that they are negligible in the device production. Note that the visual inspection of the above wafer surfaces and measurement of the haze map were performed after SC-1 cleaning following ozone cleaning of the wafers.

The results of Example 1 show that even when the concentration of ozone in the ozone cleaning solution of the ozone cleaning tank dropped to 3 ppm, impairment of the ozone cleaning ability was prevented, and consequently wafers with favorable surface quality can be obtained.

Example 2

Wafers were transferred in a similar method to Example 1 except for that transfer arms and chuck members of a transfer means were cleaned by spraying the transfer arms and the chuck members with purified water while the transfer arms and the chuck members were pulled out after being dipped in the purified water of a pure water cleaning tank for chuck members (second pure water cleaning tank). The rate of pulling the transfer arms out of the pure water cleaning tank for chuck members was 300 mm/sec. Further, the transfer arms and the chuck members were sprayed with purified water by spraying purified water 107 to the transfer arms and chuck members while being pulled out, from the pure water spray nozzles 106 placed at two positions in an upper part of the pure water cleaning tank for chuck members in FIG. 7.

The concentration of ozone in the ozone cleaning solution immediately after the transfer arms and the chuck members were dipped in the ozone cleaning tank as shown with arrow 4 was 10 ppm; the initial ozone concentration was maintained. It is considered that this is because when the transfer arms were pulled out of the pure water cleaning tank for chuck members, the transfer arms and the chuck members were sprayed with purified water, which resulted in the complete removal of alkaline component attached to the transfer arms and the chuck members.

The contact angle of the upper part, central part, and lower part of the wafer having been cleaned with this ozone cleaning solution were measured to be 10°, 10°, and 10°, respectively. Further, the surfaces of all the 50 wafers were visually inspected under a focused lamp, and no haze was observed on the wafer surfaces. Further, the haze (index of the surface roughness) map of all the 50 wafers was measured by means of the laser surface inspector to find no abnormalities.

The results of Example 2 show that the concentration of ozone in the ozone cleaning solution immediately after dipping the transfer arms and the chuck members in the ozone cleaning solution of the ozone cleaning tank did not drop, and consequently impairment of the ozone cleaning ability was prevented to provide wafers with favorable surface quality.

Example 3

Wafers were transferred in a similar method to Example 1 except for that the rate of pulling the transfer arms out of the pure water cleaning tank for workpieces was 100 mm/sec.

The concentration of ozone in the ozone cleaning solution immediately after the transfer arms and the chuck members were dipped in the ozone cleaning tank as shown with arrow 4 was 10 ppm; the initial ozone concentration was maintained. It is considered that this is because the transfer arms were pulled out of the pure water cleaning tank for workpieces at the rate as low as 100 mm/sec, which resulted in the complete removal of alkaline component attached to the transfer arms and the chuck members.

The contact angle of the upper part, central part, and lower part of the wafer having been cleaned with this ozone cleaning solution were measured to be 10°, 10°, and 10°, respectively. Further, the surfaces of all the 50 wafers were visually inspected under a focused lamp, and no haze was observed on the wafer surfaces. Further, the haze (index of the surface roughness) map of all the 50 wafers was measured by means of the laser surface inspector to find no abnormalities.

The results of Example 3 show that the concentration of ozone in the ozone cleaning solution immediately after dipping the transfer arms and the chuck members in the ozone cleaning solution of the ozone cleaning tank did not drop, and consequently impairment of the ozone cleaning ability was prevented to provide wafers with favorable surface quality.

Example 4

Wafers were transferred in a similar method to Example 2 except for that the rate of pulling the transfer arms out of the pure water cleaning tank for chuck members was 100 mm/sec.

The concentration of ozone in the ozone cleaning solution immediately after the transfer arms and the chuck members were dipped in the ozone cleaning tank as shown with arrow 4 was 10 ppm; the initial ozone concentration was maintained. It is considered that this is because the chuck members 104 on which alkaline component easily remains were sprayed with purified water and the transfer arms were pulled out of the pure water cleaning tank for chuck members at the rate as low as 100 mm/sec, which resulted in the complete removal of alkaline component attached to the transfer arms and the chuck members.

The contact angle of the upper part, central part, and lower part of the wafer having been cleaned with this ozone cleaning solution were measured to be 10°, 10°, and 10°, respectively. Further, the surfaces of all the 50 wafers were visually inspected under a focused lamp, and no haze was observed on the wafer surfaces. Further, the haze (index of the surface roughness) map of all the 50 wafers was measured by means of the laser surface inspector to find no abnormalities.

The results of Example 4 show that the concentration of ozone in the ozone cleaning solution immediately after dipping the transfer arms and the chuck members in the ozone cleaning solution of the ozone cleaning tank did not drop, and consequently impairment of the ozone cleaning ability was prevented to provide wafers with favorable surface quality.

Comparative Example 1

Wafers were transferred in a similar method to Example 1 except for that the transfer arms and the chuck members of the transfer means were not cleaned with purified water after SC-1 cleaning.

The concentration of ozone in the ozone cleaning solution immediately after the transfer arms and the chuck members were dipped in the ozone cleaning tank as shown with arrow 4 was 0 ppm; ozone in the ozone cleaning solution was decomposed to disappear. This is because alkaline component attached to part of transfer arms and chuck members was mixed into the ozone cleaning solution, which promoted the decomposition of ozone in the ozone cleaning solution to result in the disappearance of ozone in the cleaning solution.

The contact angle of the upper part, central part, and lower part of the wafer having been cleaned with this ozone cleaning solution was measured to be 60°, 20°, and 10°, respectively. Further, the surfaces of the 50 wafers were visually inspected under a focused lamp to find partial haze on each of the 50 wafers.

In the comparative example, the cleaning was performed in a state where no ozone was present in the cleaning solution (that is, in purified water). Therefore, the wafer cleaning effect was found inefficient due to loss of ozone cleaning ability.

The results of Examples 1 to 4 and Comparative Example 1 show that as compared with the comparative example, cleaning methods according to the present invention can prevent alkaline component from mixing into an ozone cleaning solution and can prevent impairment of the ozone cleaning ability, which consequently allows wafers with favorable surface quality to be obtained.

INDUSTRIAL APPLICABILITY

According to the present invention, before dipping a workpiece in an ozone cleaning solution of an ozone cleaning tank, alkaline component attached to part of transfer arms and chuck members of a transfer means is removed by cleaning, thereby preventing alkaline component from mixing in the ozone cleaning solution. Thus, ozone cleaning ability can be prevented from being impaired.

REFERENCE NUMERALS

100: Cleaning tank
101: Workpiece
102: Holding means
103: Transfer arms
104: Chuck members
105: Cleaning solution
106: Pure water spray nozzles
107: Purified water

The invention claimed is:

1. A method of cleaning a plurality of workpieces using a cleaning apparatus having a plurality of cleaning tanks including an ozone cleaning tank filled with an ozone cleaning solution and an alkaline cleaning tank filled with a solution containing an alkaline component, and a transfer means having transfer arms and chuck members provided on the transfer arms, which is movable between the plurality of cleaning tanks, comprising:
    with one workpiece of a plurality of workpieces being detachably retained by the chuck members, dipping the workpiece into a cleaning solution in one of the plurality of cleaning tanks at least together with the chuck members and part of the transfer arms;
    then detaching the chuck members from the workpiece to move the transfer means during treatment of the workpiece in the cleaning tank;
    detachably retaining another workpiece having been dipped in a cleaning solution of another cleaning tank using the chuck members; and
    treating the plurality of workpieces sequentially in each of the ozone cleaning tank and alkaline cleaning tank by transferring the workpieces with the transfer means from the ozone cleaning tank to the alkaline cleaning tank, wherein directly before the chuck members retain each of the plurality of workpieces from the ozone cleaning tank for transferring the retained workpiece to an alkaline tank, alkaline component attached to part of the transfer arms and the chuck members is removed by cleaning, thereby preventing the alkaline component from mixing into the ozone cleaning solution, and wherein during the cleaning of the plurality of workpieces there is at least one step of transferring a workpiece from the alkaline tank that is not directly preceded by a cleaning step of the transfer arms and the chuck members,
    wherein the cleaning apparatus further includes a pure water cleaning tank for workpieces, filled with purified water for cleaning the workpiece, the transfer arms and the chuck members are cleaned by being dipped in and then being pulled out of the purified water in the pure water cleaning tank for workpieces, and the transfer arms and the chuck members are pulled out at a rate of 300 mm/sec or less after being dipped in the pure water cleaning tank.

2. The cleaning method according to claim 1, wherein the cleaning apparatus further includes a pure water cleaning tank for chuck members, filled with the purified water for cleaning the transfer arms and the chuck members, and the transfer arms and the chuck members are cleaned by being dipped in and then being pulled out of purified water in the pure water cleaning tank for chuck members and by further spraying the transfer arms and the chuck members with purified water during the pullout.

3. The cleaning method according to claim 1, wherein a concentration of ozone in the ozone cleaning solution after the transfer arms and the chuck members dipped at least once in the solution containing an alkaline component in the alkaline cleaning tank are dipped in the ozone cleaning solution is 3 ppm or more.

4. The cleaning method according to claim 1, wherein the workpiece is one or a plurality of wafers, or a plurality of wafers stored in a receiver cassette.

5. A method of cleaning a plurality of workpieces using a cleaning apparatus having a plurality of cleaning tanks including at least an ozone cleaning tank filled with an ozone cleaning solution and an alkaline cleaning tank filled with a solution containing an alkaline component, and a transfer means having transfer arms and chuck members provided on the transfer arms, which is movable between the plurality of cleaning tanks, comprising:

with one workpiece of a plurality of workpieces being detachably retained by the chuck members, dipping the workpiece into the solution containing the alkaline component in the alkaline cleaning tank at least together with the chuck members and part of the transfer arms;

then detaching the chuck members from the workpiece to move the transfer means during treatment of the workpiece in the cleaning tank; and detachably retaining an other workpiece having been dipped in the ozone cleaning solution of the ozone cleaning tank using the chuck members and transferring the other workpiece to the alkaline cleaning tank, wherein directly before the chuck members retain the other workpiece from the ozone cleaning tank for transferring the retained workpiece to an alkaline tank, alkaline component attached to part of the transfer arms and the chuck members is removed by cleaning, thereby preventing the alkaline component from mixing into the ozone cleaning solution, and wherein during the cleaning of the plurality of workpieces there is at least one step of transferring a workpiece from the alkaline tank that is not directly preceded by a cleaning step of the transfer arms and the chuck members, wherein the cleaning apparatus further includes a pure water cleaning tank for workpieces, filled with purified water for cleaning the workpiece, the transfer arms and the chuck members are cleaned by being dipped in and then being pulled out of the purified water in the pure water cleaning tank for workpieces, and the transfer arms and the chuck members are pulled out at a rate of 300 mm/sec or less after being dipped in the pure water cleaning tank.

6. The cleaning method according to claim 1, wherein the pull-out rate is from 100 mm/sec to 300 mm/sec.

7. The cleaning method according to claim 5, wherein the pull-out rate is from 100 mm/sec to 300 mm/sec.

* * * * *